United States Patent
Underwood et al.

(10) Patent No.: US 12,430,579 B2
(45) Date of Patent: Sep. 30, 2025

(54) GENERATING DC OFFSETS IN FLUX-TUNABLE TRANSMONS WITH PERSISTENT CURRENT LOOPS

(71) Applicant: INTERNATIONAL BUSINESS MACHINES CORPORATION, Armonk, NY (US)

(72) Inventors: Devin Underwood, Bronx, NY (US); Jiri Stehlik, New York, NY (US); Oliver Dial, Yorktown Heights, NY (US); David Lokken-Toyli, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 450 days.

(21) Appl. No.: 17/932,656

(22) Filed: Sep. 15, 2022

(65) Prior Publication Data

US 2024/0095564 A1   Mar. 21, 2024

(51) Int. Cl.
*G06N 10/40* (2022.01)
*H10N 60/81* (2023.01)
*H10N 60/82* (2023.01)
*H10N 60/85* (2023.01)
*H10N 69/00* (2023.01)

(52) U.S. Cl.
CPC ............ *G06N 10/40* (2022.01); *H10N 60/81* (2023.02); *H10N 60/82* (2023.02); *H10N 60/85* (2023.02); *H10N 69/00* (2023.02)

(58) Field of Classification Search
CPC ................ G06N 10/40; H10N 69/00
See application file for complete search history.

(56) References Cited

U.S. PATENT DOCUMENTS

| | | |
|---|---|---|
| 10,262,727 B2 | 4/2019 | Przybysz et al. |
| 10,467,544 B2 | 11/2019 | Filipp et al. |
| 10,622,998 B1 | 4/2020 | Najafi-Yazdi et al. |
| 10,665,635 B1 | 5/2020 | Sandberg et al. |
| 10,735,003 B2 | 8/2020 | Kerman |

(Continued)

FOREIGN PATENT DOCUMENTS

| | | |
|---|---|---|
| CN | 111598248 A | 8/2020 |
| WO | 2019168708 A1 | 9/2019 |

OTHER PUBLICATIONS

Kline, J. S. et al., "Josephson phase qubit circuit for the evaluation of advanced tunnel barrier materials", Superconductor Science and Technology (2009), vol. 22, 5 pp.

(Continued)

*Primary Examiner* — Matthew L Reames
(74) *Attorney, Agent, or Firm* — Amin, Turocy & Watson, LLP

(57) ABSTRACT

A quantum circuit device includes a qubit chip including a plurality of qubits and a plurality of flux tunable couplers. A plurality of fixed frequency qubits are arranged in in a lattice structure, wherein each pair of the plurality of fixed frequency qubits is coupled to one flux tunable coupler. A wiring layer is coupled to the qubit chip, and the wiring layer includes a loop constructed of a superconducting material that is inductively coupled to the flux tunable couplers. A flux bias line is constructed of a superconducting material that is different than the superconducting material of the loop, wherein the flux bias line is inductively coupled to both the loop and the flux tunable couplers.

20 Claims, 15 Drawing Sheets

(56) References Cited

U.S. PATENT DOCUMENTS

| | | | |
|---|---|---|---|
| 10,847,705 | B2 | 11/2020 | Lampert et al. |
| 10,989,767 | B2 | 4/2021 | Ferguson et al. |
| 11,070,210 | B2 | 7/2021 | Reagor et al. |
| 2005/0045872 | A1 | 3/2005 | Newns et al. |
| 2010/0026447 | A1 | 2/2010 | Keefe et al. |
| 2016/0233860 | A1 | 8/2016 | Naaman |
| 2020/0279186 | A1 | 9/2020 | Ferguson et al. |
| 2020/0284855 | A1 | 9/2020 | Fisher et al. |
| 2021/0110291 | A1 | 4/2021 | Abdo |
| 2021/0280764 | A1 | 9/2021 | Topaloglu et al. |
| 2022/0059919 | A1 | 2/2022 | Underwood et al. |
| 2022/0140001 | A1 | 5/2022 | Heinsoo et al. |

OTHER PUBLICATIONS

Sung, Y. et al., "Realization of high-fidelity CZ and ZZ-free iSWAP gates with a tunable coupler", arXiv:2011.01261v3 (2021), 34 pgs.

Kang, J.H. et al., "Current Recycling and SFQ Signal Transfer in Large Scale RSFQ Circuits", IEEE Transactions on Applied Superconductivity (2023), vol. 13:2 pp. 547-550.

Search Report and Written Opinion issued Dec. 13, 2023 in related application No. PCT/IB2023/058760, 15 pgs.

Gu, X. et al., "Topological Edge States And Pumping In A Chain Of Coupled Superconducting Qubits", Cornell University Library, arXiv:1711.06829v1, (2017); 13 pgs.

Schwarz, M. J. et al., "Gradiometric Flux Qubits With A Tunable Gap", New Journal Of Physics (2013); vol. 15; 21 pgs.

Kim, M. et al., "Current Biased Gradiometric Flux Qubit In A Circuit-QED Architecture", New Journal Of Physics (2021). vol. 24, 11 pgs.

Mostame, S. et al., "Emulation Of Complex Open Quantum Systems Using Superconducting Qubits", Quantum Information Processing (2016); vol. 16:2; 16 pgs.

Miano, A. et al., "Frequency-Tunable Kerr-Free Three-Wave Mixing With A Gradiometric SNAIL", Cornell University Library, arXiv:2112.09785v1 (2021); 5 pgs.

Bleszynski-Jayich, A.C. et al., "Persistent Currents in Normal Metal Rings: Comparing High-Precision Experiment with Theory", https://arxiv.org/ftp/arxiv/papers/0906/0906.4780.pdf; downloaded Sep. 15, 2022; 42 pgs.

Orlando, T. P. et al., "A Superconducting Persistent Current Qubit"; https://arxiv.org/pdf/cond-mat/9908283.pdf, (2019); 15 pgs.

Gabriella, M. et al., "Static Flux Bias of a Flux Qubit Using Persistent Current Trapping"; https://arxiv.org/ftp/cond-mat/papers/0608/0608115.pdf; downloaded Sep. 15, 2022, 9 pgs.

GENERATING DC OFFSETS IN FLUX-TUNABLE TRANSMONS WITH PERSISTENT CURRENT LOOPS

BACKGROUND

Technical Field

The present disclosure generally relates to superconducting quantum computing, and more particularly, to generating constant flux offsets in tunable transmon qubits with persistent current loops or with contiguous flux bias lines that couple to multiple qubits.

Description of the Related Art

Flux tunable qubits (which are also known as "flux tunable buses") use a DC current that generates a magnetic flux Φ 0 to adjust the frequency of objects such as a flux tunable transmon bus. A DC current flows through a superconducting wire that is adjacent to the flux tunable transmon to generate an evanescent magnetic field that produces the flux. However, the DC current can adversely affect operation of the cryostat by generating unwanted heating. In a bus below qubit (BBQ) architecture, the DC current is adjusted until a minimum ZZ exchange occurs between fixed-frequency qubits (e.g., Q0 and Q1) coupled between a flux tunable transmon. The DC current of the flux tunable transmon is adjusted to close to its minimum value, corresponding to a magnetic flux Φ DC. Bias currents can range from about 100 μA to 1 mA, depending on device parameters. Due to disorder in device fabrication, each flux tunable qubit requires a unique magnetic field. These DC currents give rise to steady state heating, ground loops, and on-chip cross-talk.

SUMMARY

According to one embodiment, a quantum circuit device includes a qubit chip including a plurality of qubits and a plurality of flux tunable transmon couplers. A plurality of fixed frequency transmon qubits are arranged in a lattice structure, wherein each pair of the plurality of fixed frequency transmon qubits is coupled to one flux tunable transmon coupler. A wiring layer is coupled to the qubit chip, wherein the wiring layer includes a loop constructed of a superconducting material that is inductively coupled to the flux tunable transmon couplers. A flux bias line constructed of a superconducting material that is different than the superconducting material of the loop, wherein the flux bias line is inductively coupled to both the loop and the flux tunable transmon. This construction provides an advantage by reducing current that passes into a cryostat, and reduces or eliminates an adverse effect on the superconductive conductive components from increased heat.

In an embodiment, the wiring layer further includes a first flux bias line is constructed of a first superconducting material and configured to receive a DC current and at least one current pulse ($i_{pulse}$, that are inductively coupled to a first flux tunable transmon. A first loop is formed by a second superconducting material, and is inductively coupled to the first flux bias line, and inductively coupled to the first flux tunable transmon. The magnetic field generated from the first flux bias line is configured to induce a persistent current in the first loop formed by the second superconducting material and a static flux offset ($\Phi_{offset}$) through the first flux tunable transmon. This construction provides an offset flux to reduce the persistent current in a superconducting loop to keep the temperature within an operable range.

In an embodiment, which may be combined with the preceding embodiments, a signal generation module is configured to source the DC current to induce the persistent current in the first loop, the signal generation module is configured to adjust the DC current to reduce an always-on entanglement (ZZ) between a pair of fixed-frequency qubits coupled to the first flux tunable couplers to a minimum. It is an advantage to have the least amount of entanglement ZZ between the fixed frequency qubits of a flux tunable transmon to provide a less-complicated and more efficient structure.

In an embodiment, which may be combined with the preceding embodiments, a signal generation module configured to source the at least one current pulse ($i_{pulse}$) through the flux bias line; and a value of each one current pulse is based on a value of the $\Phi_{offset}$. The current pulses can provide a fine tuning of the current that enters the cryostat through a flux wire.

In an embodiment, which may be combined with the preceding embodiments, the first superconducting material is niobium and the second conductive material is aluminum. Niobium has a higher Tc while Aluminum has a lower Tc, and these two metals may be used in respective components. The lower Tc allows for the persistent currents to be reset at a lower temperature.

In an embodiment, which may be combined with the preceding embodiments, the flux bias line includes one or more gradiometric loops. The gradiometric loops have a structure that reduces cross-talk issues with other loops on the interposer and provides for more efficient operation of the flux tunable transmons.

In an embodiment, which may be combined with the preceding embodiments, the first flux tunable transmon and the fixed frequency qubits are arranged in a lattice structure to form a multi-qubit device. The lattice structure may be more efficient, particularly in a case where there are additional dimensioned components, such as multiple stacks.

In an embodiment, the flux bias line is a meandering bias line contiguous to the plurality of flux tunable couplers and configured to bias the plurality of flux tunable couplers substantially simultaneously. The use of a meandering bias line may reduce an amount of cross-talk.

In an embodiment, which may be combined with the preceding embodiments, each of the flux tunable transmons is capacitively coupled to two fixed frequency qubits, and each fixed frequency qubit is capacitively coupled to two flux tunable transmons. This alternative construction provides more flexibility in construction and operation.

In an embodiment, which may be combined with the preceding embodiments, a global flux line is arranged on the wiring layer proximal to the persistent current loops configured to receive an input of the DC current and generate a magnetic field within the persistent current loops. The induction from the global flux line reduces an inductive coupling in the flux tunable transmons. The global flux line reduces or eliminates parasitic effects of having the loops SC1 and SC2 on the same chip.

In an embodiment, which may be combined with the preceding embodiments, the second superconducting material is shorted between two sections of a continuous flux bias line, wherein a loop is formed on each flux bias line. The second superconducting material has a critical temperature (Tc) lower than a critical temperature of the first superconducting material and configured to generate a persistent current ($i_p$) that gets trapped in a loop formed of the overlapping superconductors. The persistent current loops are configured to generate a calibrated flux offset ($\Phi_{offset}$) based on applied temperature variations to the superconducting materials in the flux tunable transmons. The short circuiting of the first material by utilizing a second material allows for a less complicated way to trap a current.

According to one embodiment, a quantum circuit device includes a qubit chip having a plurality of qubits, and a wiring layer coupled to the qubit chip. The qubit chip includes a plurality of flux tunable elements, wherein each flux tunable element includes a respective flux tunable superconducting quantum interference (SQUID) loop, and each flux tunable element is coupled between a respective pair of fixed-frequency qubits. The wiring layer includes a contiguous flux bias line constructed of a first superconducting material disposed proximal to the flux tunable elements, and configured to output a DC current to provide an offset to the flux tunable elements simultaneously. A plurality of flux bias lines are disposed non-contiguously to the flux tunable elements, wherein each of the flux bias lines is configured to output flux pulses and independently offset currents with a mutual inductance with the flux tunable elements. This construction provides an advantage by reducing current that passes into a cryostat, and reduces or eliminates an adverse effect on the superconductive conductive components from increased heat.

In an embodiment, the contiguous flux bias line is on a first side of the flux tunable elements, and the plurality of flux bias lines disposed non-contiguously are proximal to a second side of the flux tunable elements.

In an embodiment, which may be combined with the preceding embodiments, the plurality of flux bias lines are gradiometric flux coils. This construction reduces/eliminates crosstalk due to mutual inductance between the common DC line and pulsed lines.

In an embodiment, the flux couplers on the qubit chip each have two spatially separated pickup coils being separately coupled to the contiguous bias line and the independent flux bias lines.

According to one embodiment, a method of generating DC offsets in flux-tunable elements includes inputting a DC current to a flux bias line in proximity to the flux tunable element when a temperature of a first superconducting material is above a critical temperature (Tc) to inductively couple the flux bias line to both the flux tunable element and a loop constructed of the first superconducting material that encircles the flux tunable element. The flux bias line is constructed of a second superconducting material that is different than the first superconducting material. There is a continued inputting of the DC current to the flux bias line while cooling the first superconducting material below the Tc of the first superconducting material to trap a persistent current within the superconducting loop. This method provides a quantum circuit with reduced current passing into a cryostat, and reduces or eliminates an adverse effect on the superconductive conductive components from increased heat.

In an embodiment, the inputting of the DC current is continued until the persistent current produces a minimum ZZ exchange rate between a first fixed frequency qubit and a second fixed frequency qubit. The minimum ZZ exchange rate has the least amount of entanglement between the fixed frequency qubits to provide a less complicated and more efficient structure.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
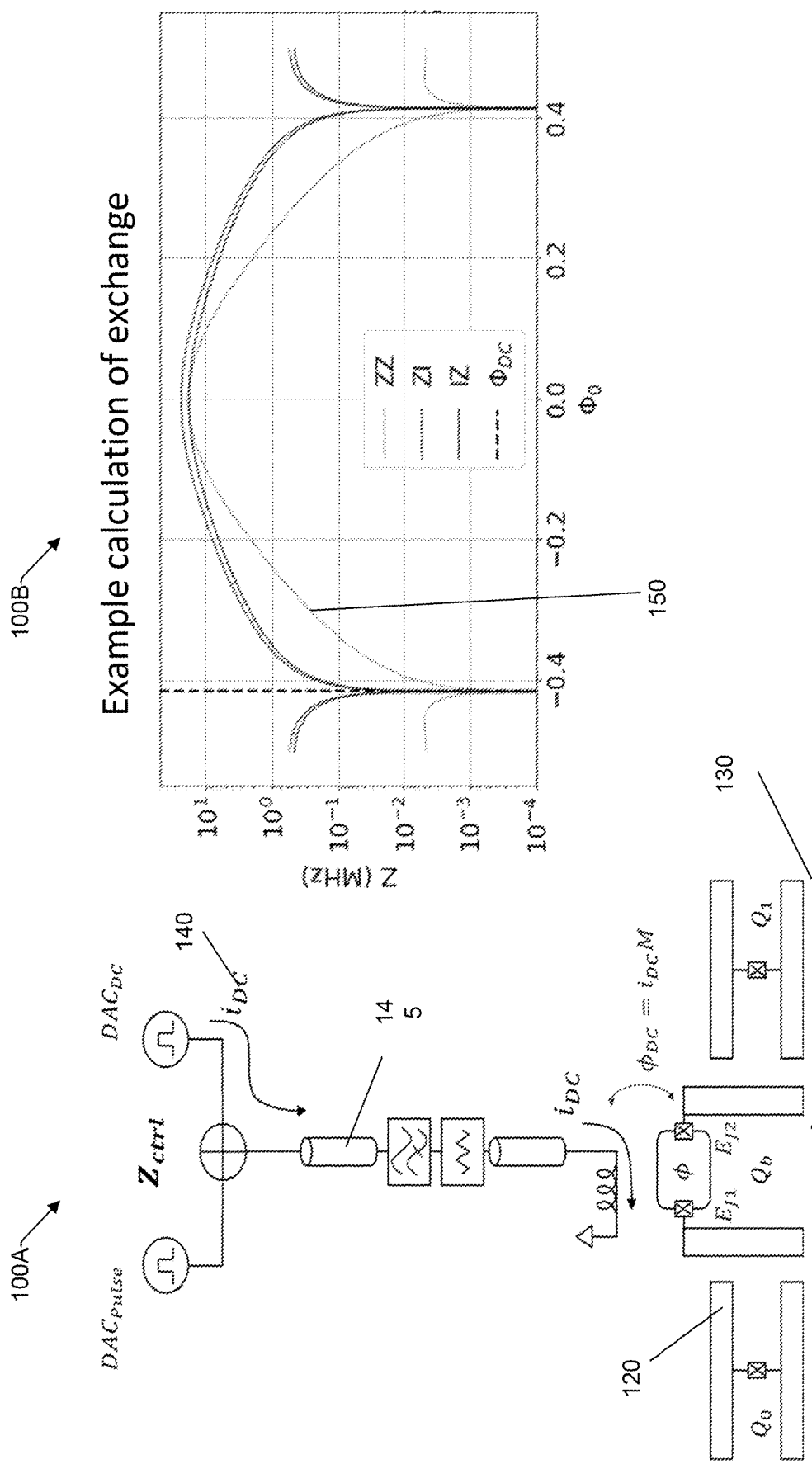
FIGS. 1A and 1B illustrate a flux tunable transmon and graph showing an example of range calculation, respectively, consistent with an illustrative embodiment.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

In discussing the present technology, it may be helpful to describe various salient terms. In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. As used herein, the term "mechanically tolerant" relates to electrical properties not being significantly affected by the mechanical alignment between subject components.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The ability to include more superconducting qubits is salient to being able to realize the potential of quantum computers. However, it is challenging to yield quantum processors on a monolithic qubit chip that have desired qubit characteristics, such as frequency, fidelity, etc. A modular architecture constructed of smaller modular units of devices that are interconnected can make it more feasible to realize a large-scale quantum processor. However, such modular architecture may involve connections between qubits on separate physical chips and/or supporting circuitry for the qubit chip. Various quantum phenomena, such as superposition and entanglement, do not have analogs in the world of classical computing and therefore may involve special structures, techniques, and materials in order to assemble electronic devices that may operate in a cryogenic environment.

As used herein, the term "critical temperature" (Tc) is defined as a superconductor having a characteristic temperature below which the resistance drops abruptly to zero. In addition, the term "ZZ" is to be understood here to refer to a rate of entanglement between two bits.

In one aspect, the teachings herein are based on the inventors' insight that directly applying conventional integrated circuit techniques for interacting with computing elements to superconducting quantum circuits may not be effective because of the unique challenges presented by quantum circuits that are not presented in classical computing architectures. Indeed, many of the systems and architectures discussed herein are operated in a cryogenic environment and may involve superconductivity. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for connecting components of a quantum computer. The techniques described herein may be implemented in a number of ways. Example implementations are provided below with reference to the following figures.

According to some embodiments of the present disclosure, through the use of persistent currents, there is a minimizing/reducing the current dumped into the cryostat, and overcoming the problem of transferring heat to the cryostat. A large amount of current can be supplemented with persistent currents, and fine tune the flux offset for each individual transmon bus, as the flux offset for each of the transmon buses may vary such that a global flux offset cannot be used. A shared flux bias line is provided for operation multi-qubit devices, and in some embodiments there are gradiometric flux couplers. The embodiments of the present disclose result in a reduced on-chip current per flux line, resulting in reduced power dissipation per flux line. The impact of cross talk between adjacent couplers is reduced with reduced power usage, as well as a reduction in heat that to reduce the problem of current possibly heating the cryostat.

Example Architecture

FIGS. 1A and 1B respectively illustrate a flux tunable transmon 100A and graph 100B showing an example of range calculation, consistent with an illustrative embodiment. The disclosure presents a number of ways that a DC offset may be generated to limit a current that is provided to a cryostat that can adversely affect superconducting. A flux tunable transmon 110 is coupled to a first fixed frequency qubit 120 and a second fixed frequency qubit 130. A DC current (iDC) 140 passes through lines which are representative of lines in a cryostatic refrigerator that passes through an inductor 145 and a magnetic field changes the flux that corresponds to the x axis shown in FIG. 1B. The minimum value ZZ 150 corresponds to the least amount of entanglement between the two qubits 120, 130 shown in FIG. 1A. The result is that the current that enters the cryostat will be reduced so that heat does not adversely affect the superconducting operations. Additional features of the present disclosure are disclosed herein.

Example Embodiments

Figure 2:
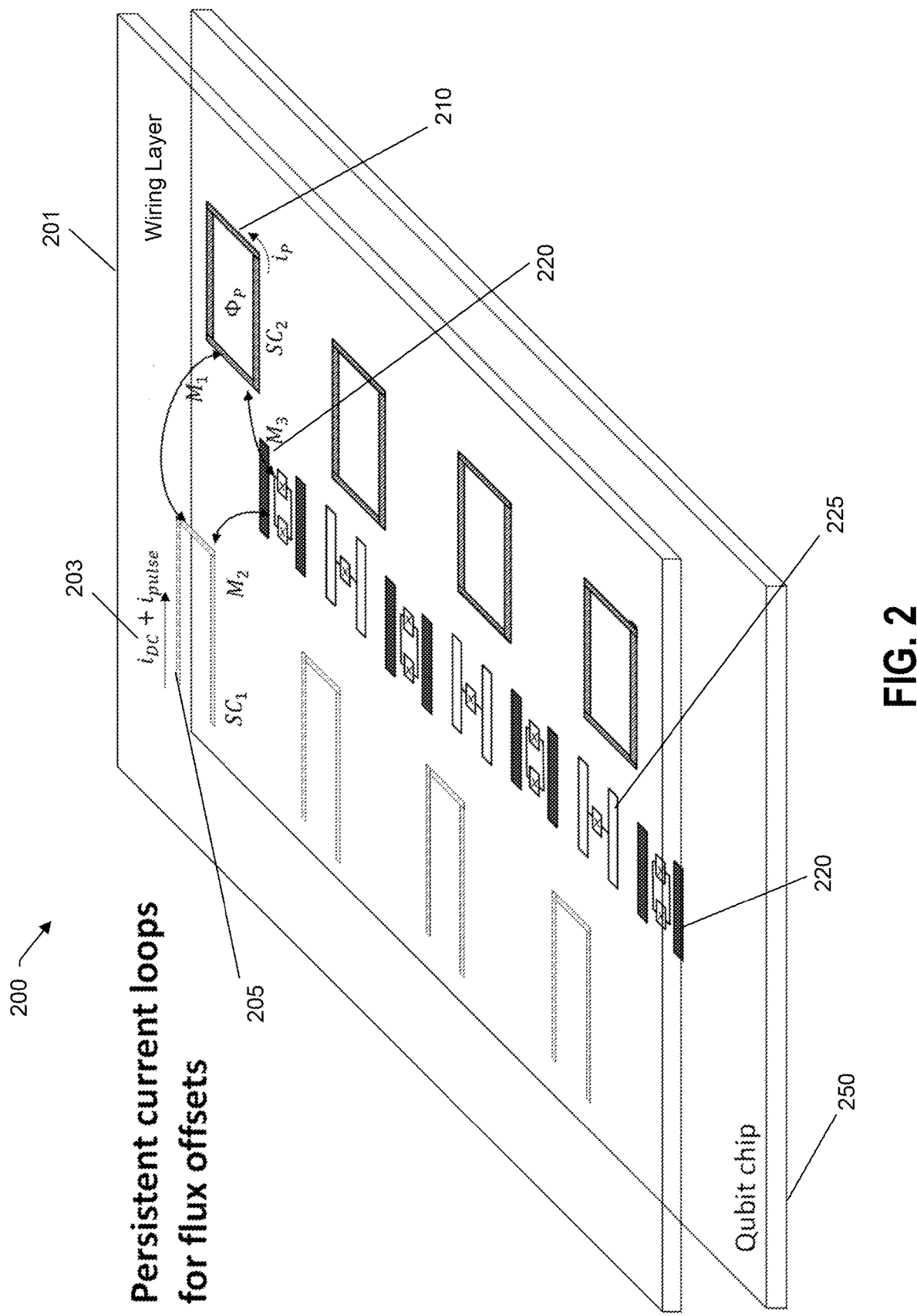
FIG. 2 illustrates a structure for generating a DC offset using persistent current loops for flux offset, consistent with an illustrative embodiment.

FIG. 2 illustrates a structure for generating a DC offset using persistent current loops for flux offset, consistent with an illustrative embodiment. A DC current 203 (iDC) is sourced through a flux bias line 205 composed of superconductor $SC_1$. A loop composed 210 of a superconductor $SC_2$ generates a current $i_p$ that opposes an applied magnetic flux $\Phi_p$. The value of $\Phi_p$ is: $\Phi_p = i_{DC} M_1$, wherein $M_1$ is an inductance between the flux bias line 205 and the loop 210. The current $i_p$ becomes persistent if flux is present during the transition from a normal state to a SC state. The loop's persistent current $i_p$ generates a flux that threads the loop of a flux tunable transmon; resulting in a flux offset: $\Phi_{offset} = i_p M_3$, wherein $M_3$ is an inductance between the flux transmon 220 and the loop 210. The $\Phi_{offset}$ is calibrated by thermally cycling the device and repeating the trapping experiment, until the ZZ between fixed frequency qubits is close to a minimum. Current pulses $i_{pulse}$ are also sourced thru the flux bias line in order to generate 2Q gates. Pulsing only occurs after $\Phi_{offset}$ has been calibrated, and device is cold. It is to be understood that although in FIG. 2 the wiring layer 201 above the qubit chip 250 on which the persistent current loop is shown is not limited to an interposer. For example, other types of structures may be used so long as there is a mutual inductance to a superconducting quantum interference (SQUID) loop of the qubit chip 250.

Figure 3:
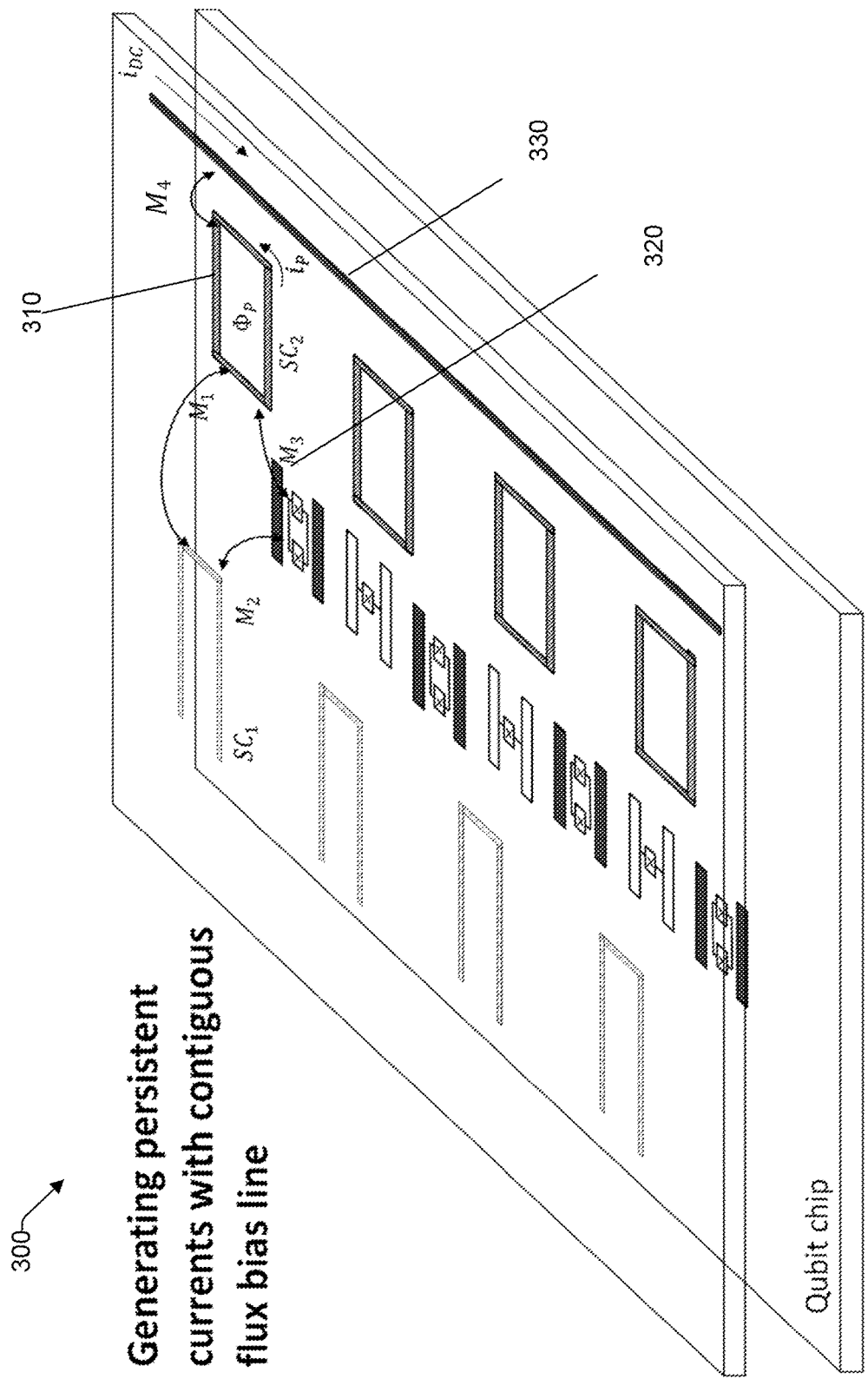
FIG. 3 illustrates a structure for generating persistent currents with a contiguous flux bias line, consistent with an illustrative embodiment.

FIG. 3 illustrates a structure 300 for generating persistent currents with a contiguous flux bias line, consistent with an illustrative embodiment. It is to be understood that while transmons are discussed in FIG. 3 for illustrative purposes, the present disclosure is not limited to transmon couplers. Other types of flux tunable elements may be provided. For example, any superconducting qubit that is made tunable by a flux loop (or squid), will have a potential application of the flux tunable couplers disclosed herein. Flux tunable transmon qubits, facemons, and even X-mons may all benefit from the application of the apparatus and method discloses herein. If the qubit has a squid loop, it will an adjustable DC offset can be provided to bias the qubit it to the ideal frequency.

Loops 305 are inductively coupled to the transmons 320 and the loops 310 by the current iDC input to the global flux line 330. Current pulses that are applied on a flux line that is inductively coupled to a persistent current loop may have unintended consequences, and may impact signal integrity of flux pulse. However, in the embodiment shown in FIG. 3, some adverse effects associated with the inductive coupling $M_1$ (such as cross-talk) are reduced, and a persistent current is generated using a global bias line 330 contiguous to loops 310 with inductive coupling $M_4$. The transmon 320 is inductively coupled to the loop 310 as shown by the coupling $M_3$. It is to be understood that the fixed frequency qubits at the edge of a wiring layer (e.g., an interposer) may be coupled to a single flux tunable transmon. The transmons can operate without the two coupled flux tunable transmons for easier construction.

Figure 4:
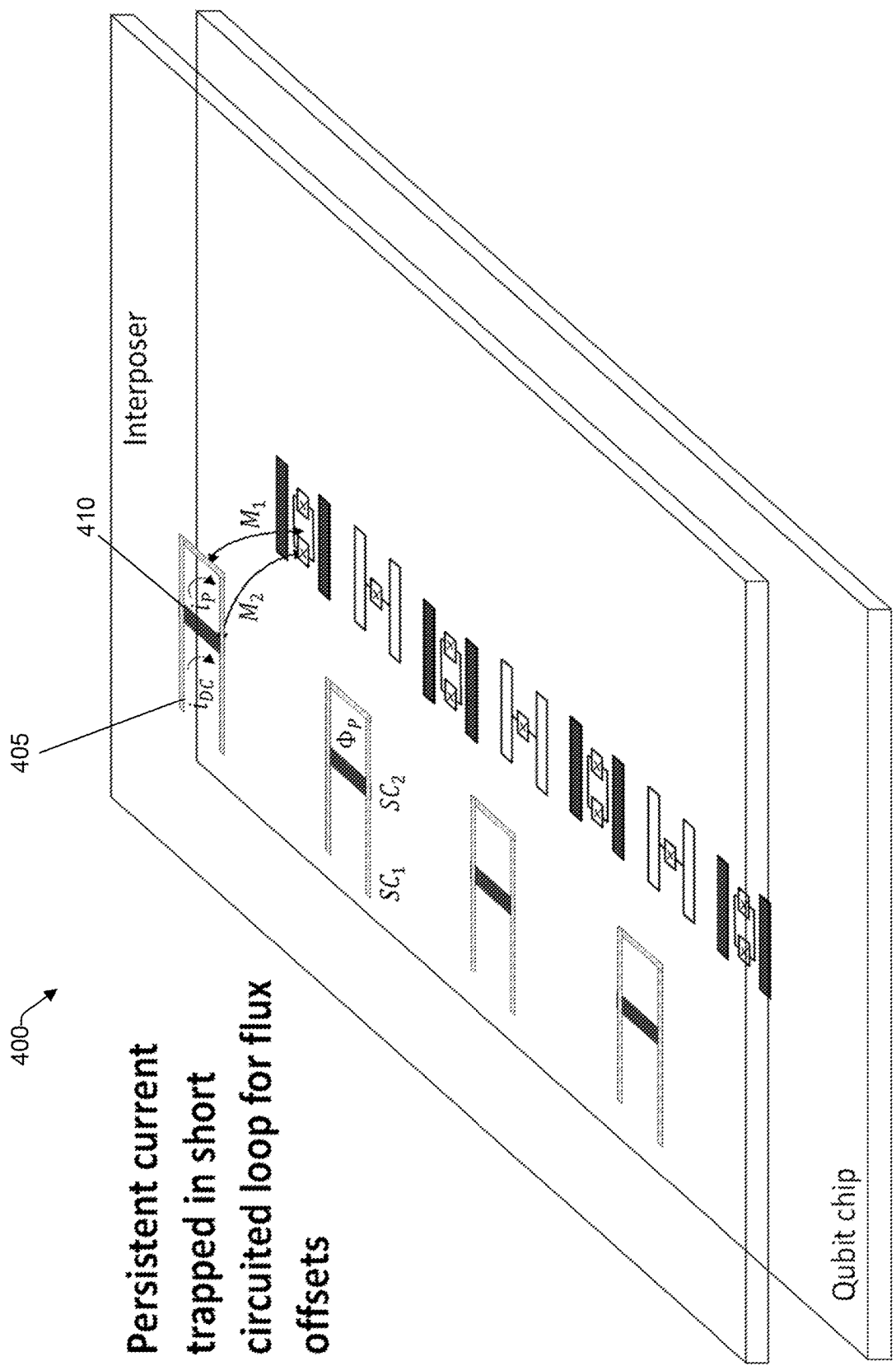
FIG. 4 illustrates a structure for generating persistent currents trapped in a short-circuited loop for flux offsets, consistent with an illustrative embodiment.

FIG. 4 illustrates a structure 400 for generating persistent currents trapped in a short-circuited loop for flux offsets, consistent with an illustrative embodiment. A DC current (iDC) is sourced through a flux bias line 405 composed of superconductor $SC_1$. The flux bias line is shorted with a second superconducting material $SC_2$ 410 that has a lower critical temperature than $SC_1$. The DC current gets applied before the $SC_2$ critical temperature, and remains as the device is cooled. The DC current is applied before the $SC_2$ critical temperature, and remains ON until the device is cooled; trapping a persistent current $i_p$ in shorted loop with mutual inductance $M_1$. Additional DC currents, and flux pulses are used to further bias the coupler with a second mutual inductance $M_2$.

Figure 5:
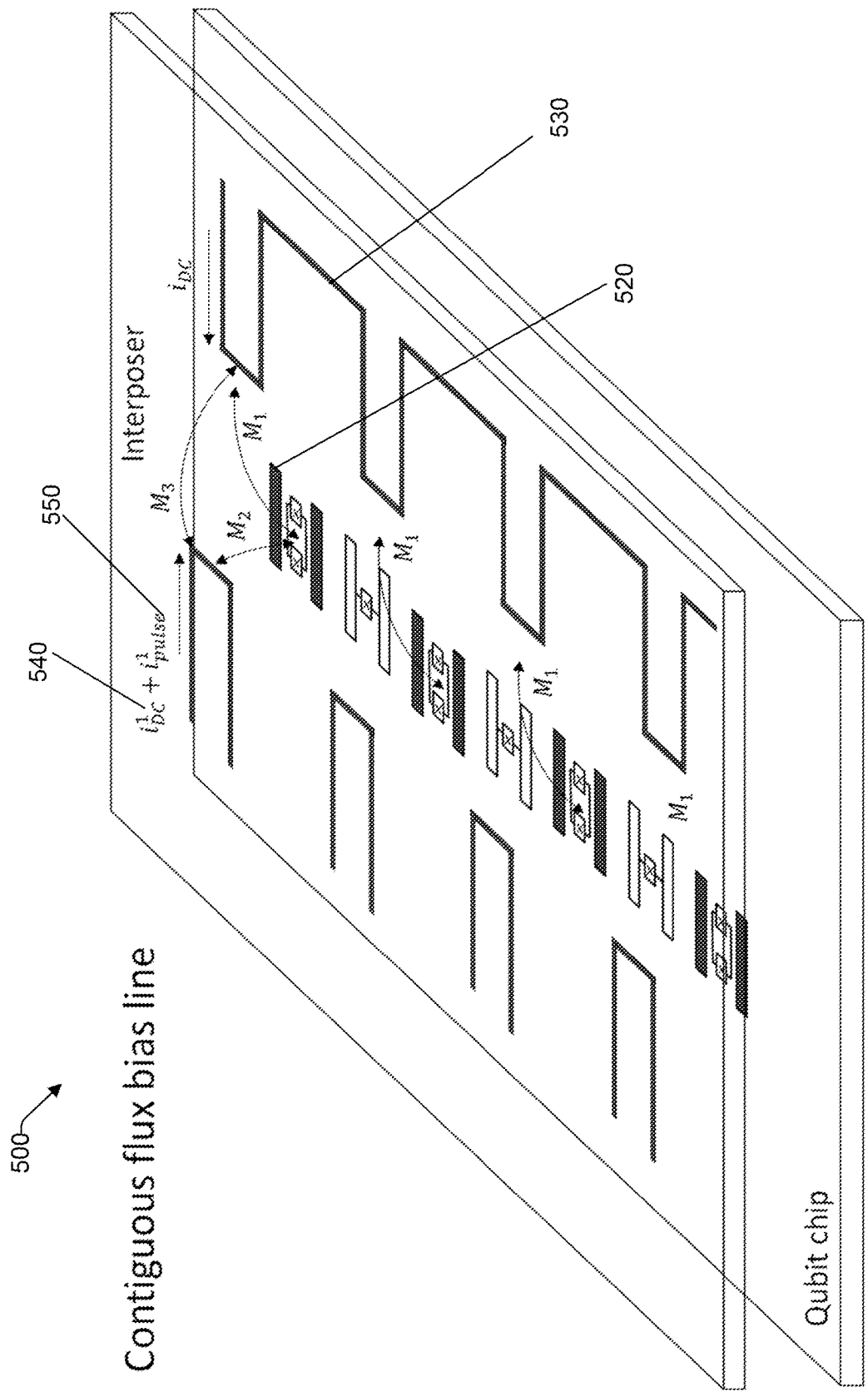
FIG. 5 illustrates a structure including a contiguous flux bias line adjacent to the flux tunable transmon, consistent with an illustrative embodiment.

FIG. 5 illustrates a structure 500 including a contiguous flux bias line adjacent to the flux tunable transmon, consistent with an illustrative embodiment. A long contiguous flux bias line 530 is adjacent to the flux tunable transmon 520 with a mutual inductance $M_1$. A DC current (iDC) applied to the contiguous line 530 provides an offset to all flux tunable transmons simultaneously. Flux pulses 540 and small DC offset currents 550 can be applied by the standard flux bias lines with mutual inductance $M_2$.

Figure 6:
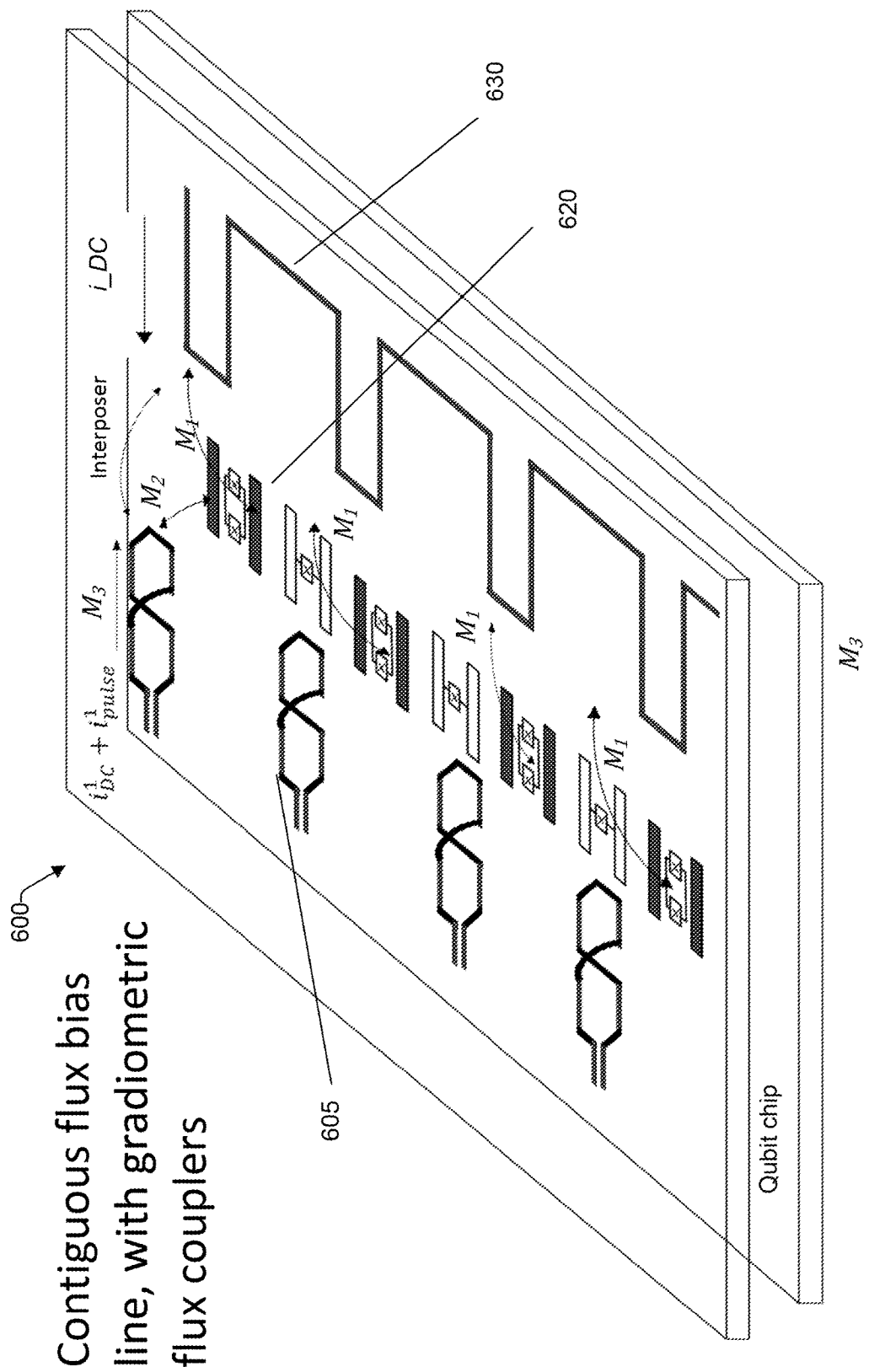
FIG. 6 illustrates a structure including a contiguous flux bias line with gradiometric flux couplers, to the flux tunable transmon, consistent with an illustrative embodiment.

FIG. 6 illustrates a structure 600 including a contiguous flux bias line 630 with gradiometric flux couplers 605 to the flux tunable transmon 620, consistent with an illustrative embodiment. Gradiometric flux bias lines reduce the impact of stray magnetic fields, which are substantially canceled due to the structure of such gradiometric coils.

Figure 7:
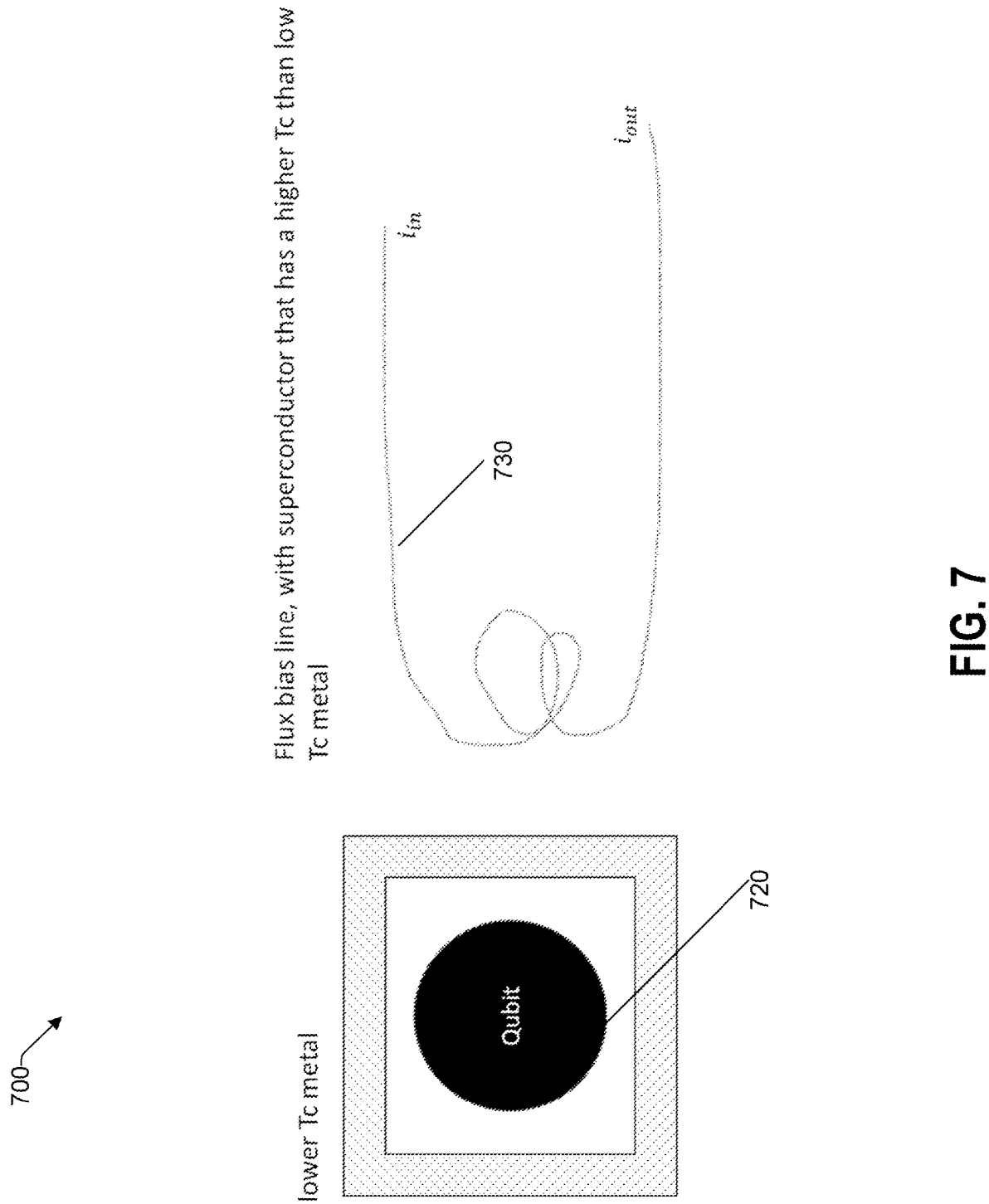
FIG. 7 illustrates a structure including a lower Tc metal than a Tc of a superconductor of a flux bias line, consistent with an illustrative embodiment.

FIG. 7 illustrates a structure 700 including a lower Tc metal than a Tc of a superconductor of a flux bias line, consistent with an illustrative embodiment. A flux bias line 730 is constructed of superconductor that has a higher Tc than the low Tc metal looped around the qubit.

Figure 8:
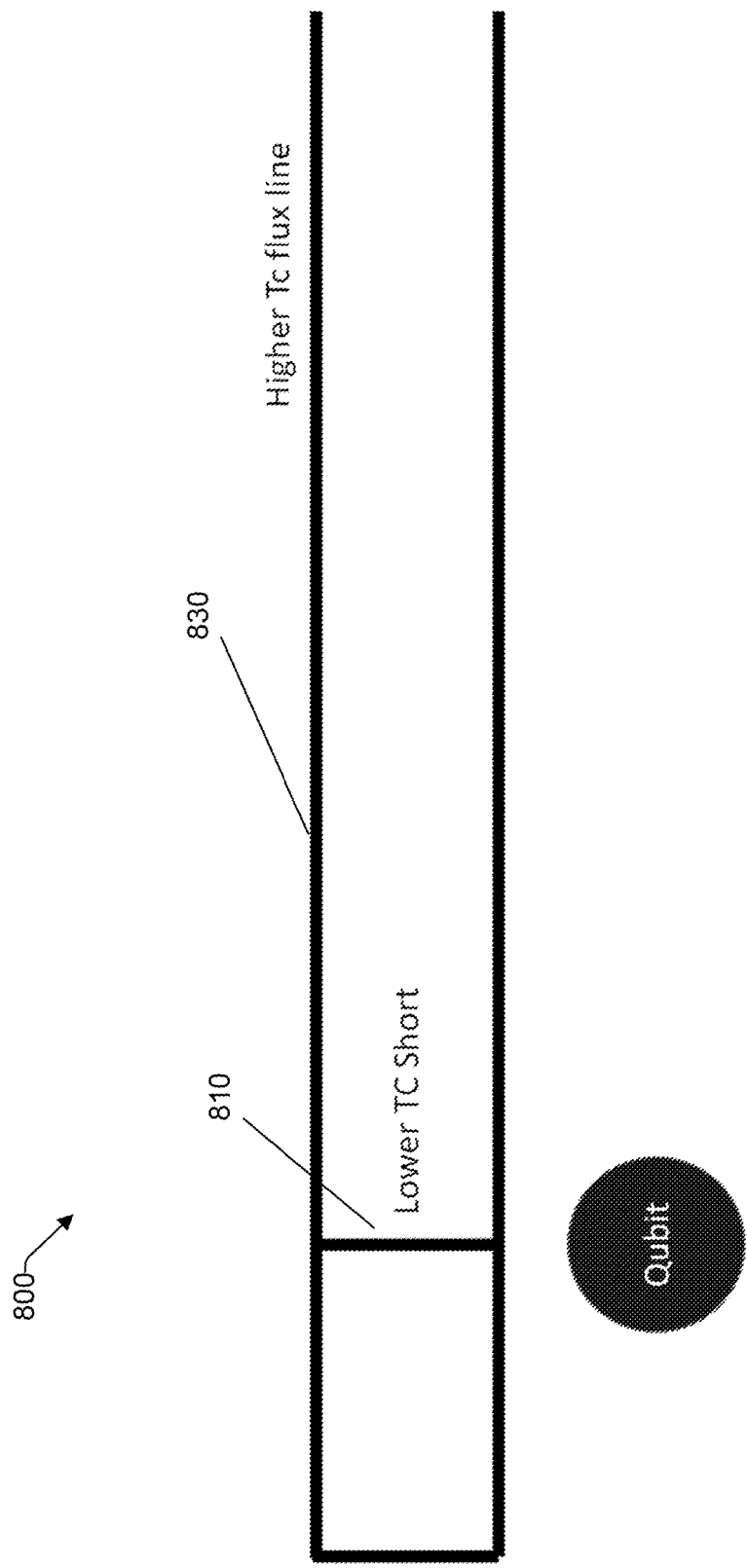
FIG. 8 illustrates a structure including a lower Tc short, consistent with an illustrative embodiment.

FIG. 8 illustrates a structure 800 including a lower Tc short, consistent with an illustrative embodiment. The flux line 830 is constructed of an SC metal having a higher Tc than the short metal 810 that is constructed of a metal having a lower Tc.

Figure 9:
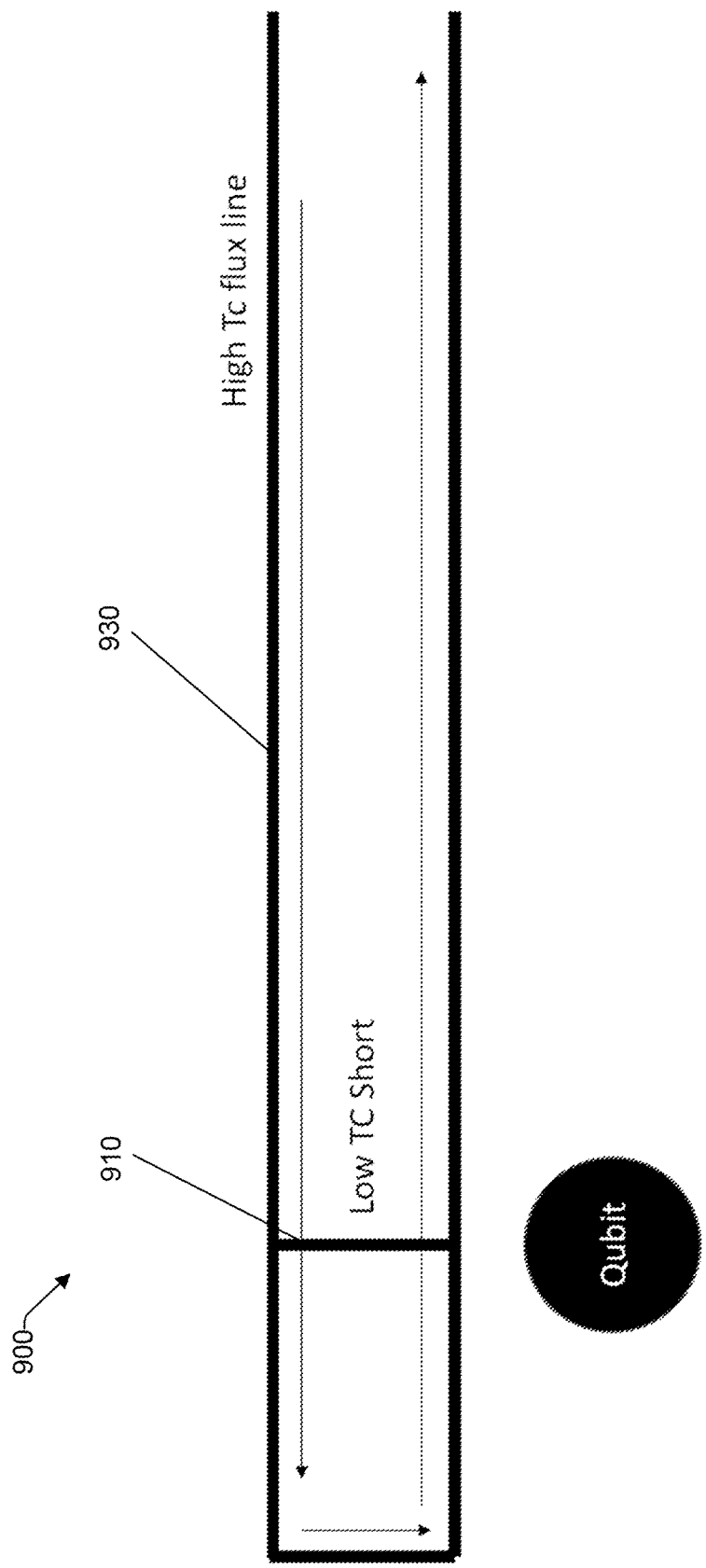
FIG. 9 illustrates another structure including a lower Tc short, consistent with an illustrative embodiment.

FIG. 9 illustrates the current flow in a structure 900 including a lower Tc short, consistent with an illustrative embodiment. The structure is similar to FIG. 8, which a high Tc flux line 930 and a short line 910 constructed of an SC material having a lower Tc. The current is applied with a temperature above the low Tc.

Figure 10:
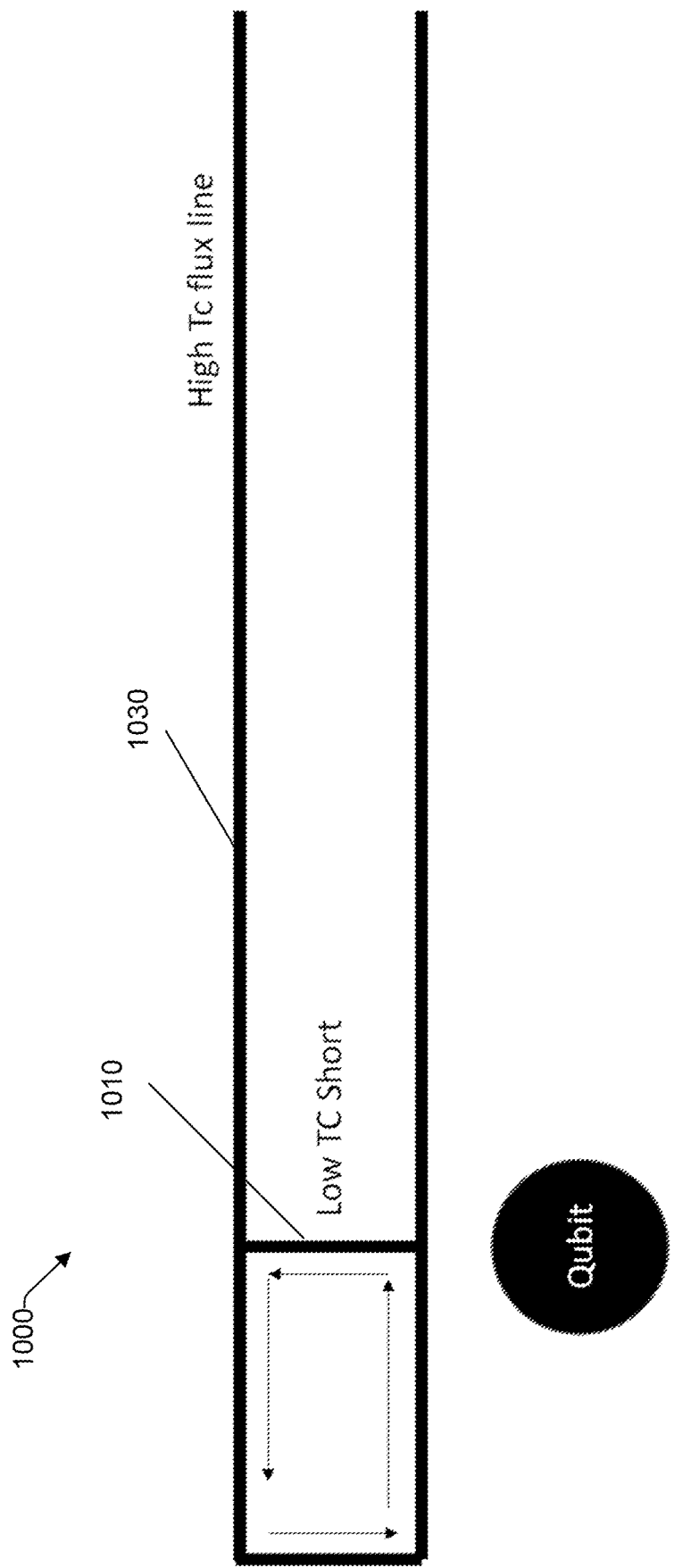
FIG. 10 illustrates yet another structure including a lower Tc short showing a path of current flow, consistent with an illustrative embodiment.

FIG. 10 illustrates a structure 1000 including a lower Tc short showing a path of current flow, consistent with an illustrative embodiment. A current is applied to the flux line 1030 with a temperature above the low Tc of the short material 1010. The temperature is then reduced below Tc to cause the material 1010 to form a short. The external current is then removed. The Flux in small loop is constant, so the current is persistent.

Figure 11:
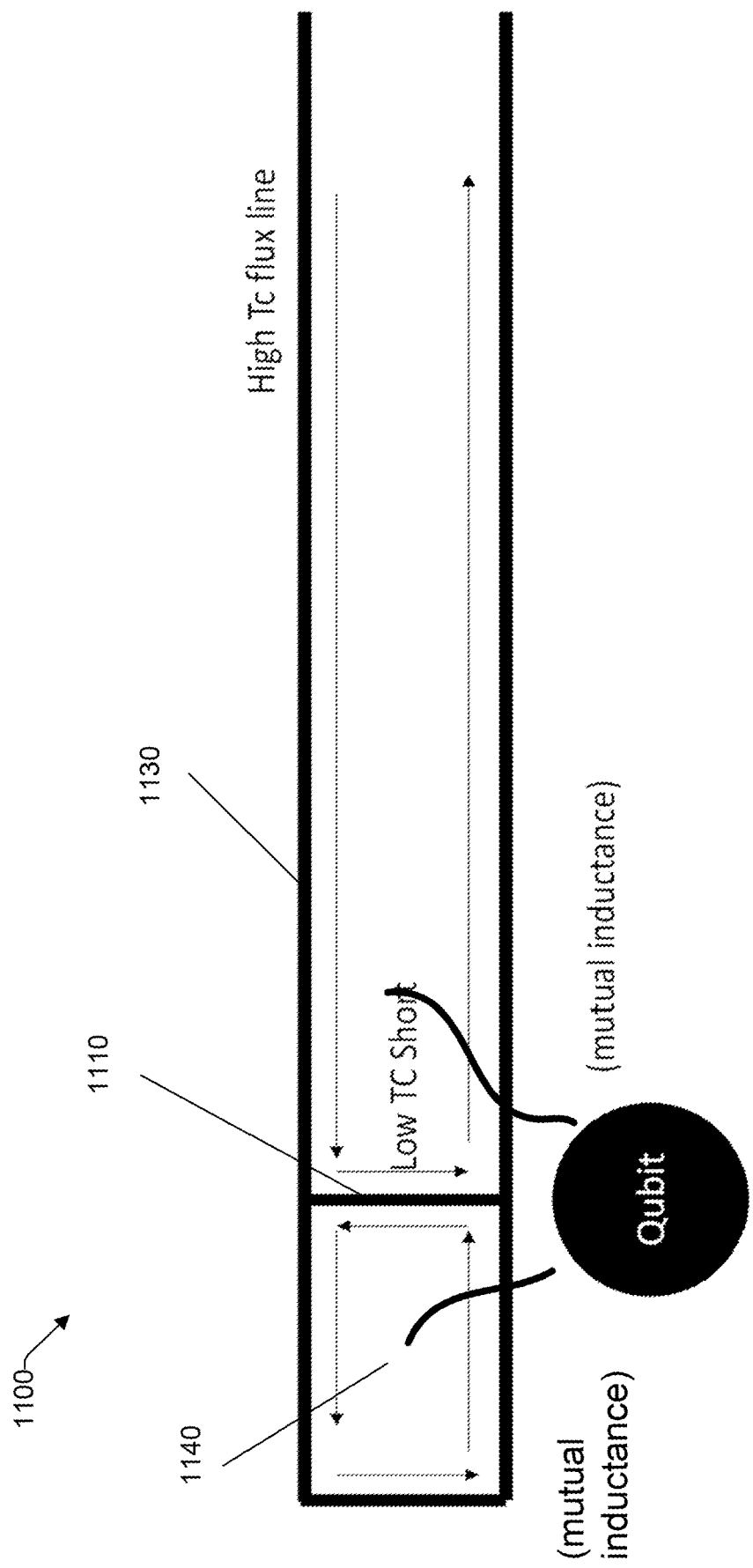
FIG. 11 illustrates a structure using mutual inductance, consistent with an illustrative embodiment.

FIG. 11 illustrates a structure 1100 using mutual inductance, consistent with an illustrative embodiment. There is a high Tc flux line 1130 and a low Tc short line 1110. Current is applied when the temperature is above the low Tc. In operation, after the current is applied, the temperature is reduced below the Tc of the shorted material 1110. Then, the external current is removed from the flux line 1130. The flux in the small loop 1140 is constant, so the current in the small loop 1140 is persistent. Then a, DC or AC additional current is applied, which also biases the qubit without changing the value of the persistent current.

Figure 12:
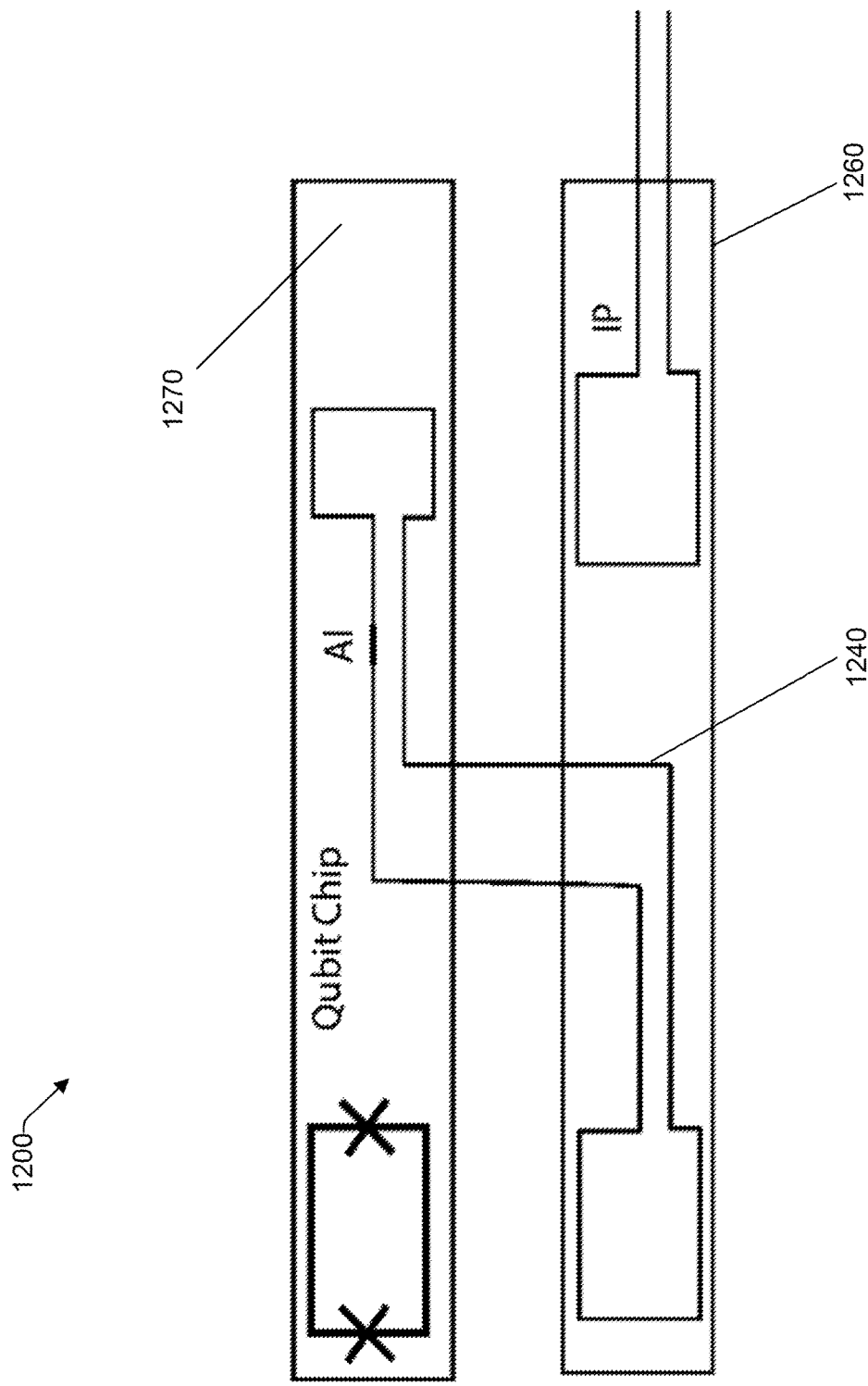
FIG. 12 illustrates a structure having a flux line that is inductively coupled to a loop that can house a persistent current, consistent with an illustrative embodiment.

FIG. 12 illustrates a structure 1200 having a flux line that is inductively coupled to a loop that can house a persistent current, consistent with an illustrative embodiment. As shown, the loop 1240 straddles the interposer 1260 and the qubit chip 1270. The use of an aluminum strip enables the persistent current to be reset to a value that operates at a lower temperature. It is to be understood that the present disclosure is not limited to the use of the interposer 1260, and other structures including but not limited to a wiring layer can be used.

Figure 13:
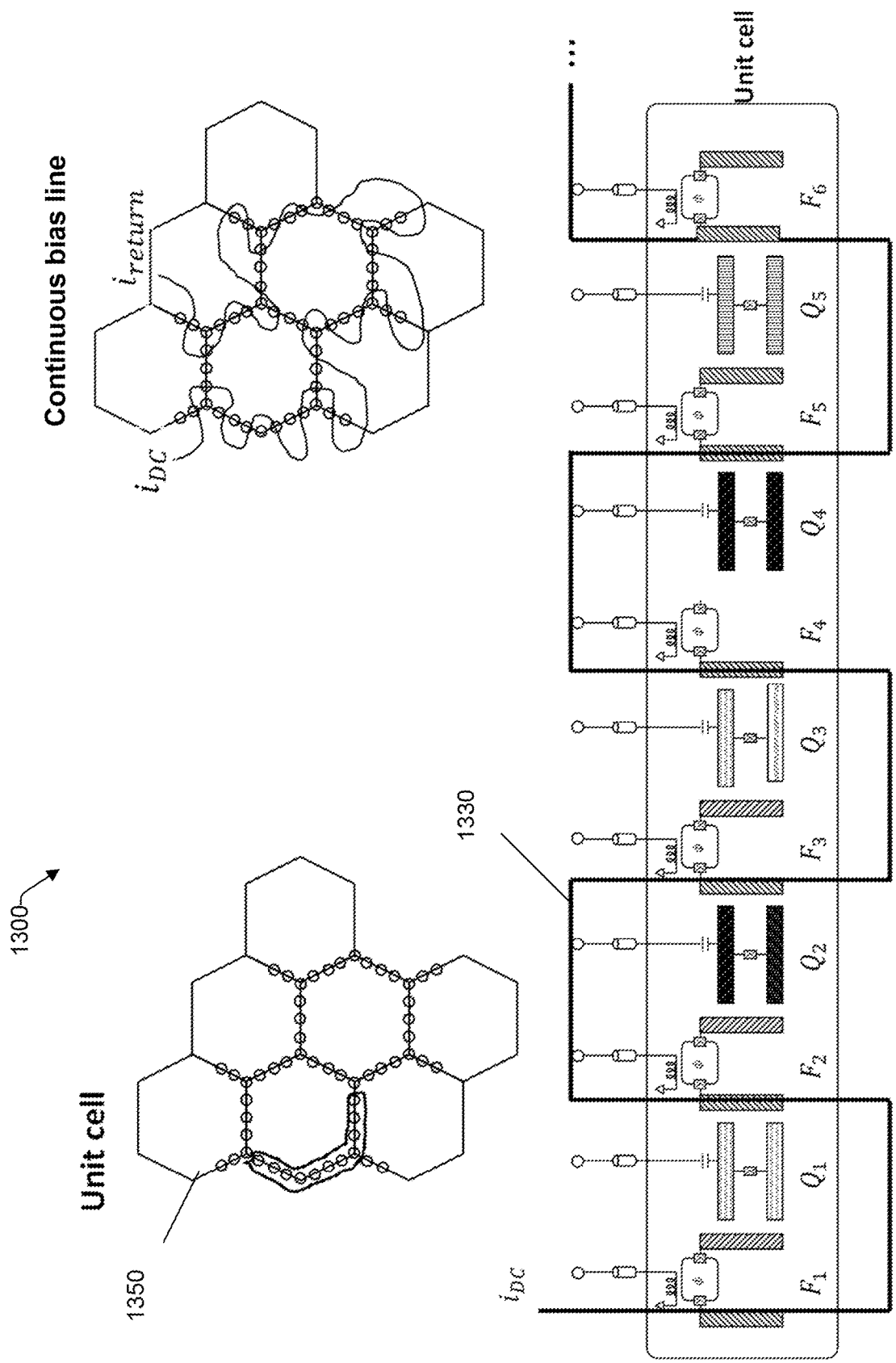
FIG. 13 illustrates a structure including a plurality of qubits and a plurality of flux tunable buses, consistent with an illustrative embodiment.

FIG. 13 illustrates a structure including a plurality of qubits and a plurality of flux tunable buses, consistent with an illustrative embodiment. A single meandering line 1330 simultaneously biases all the flux tunable buses. The unit cell 1350 shown has five qubits (e.g. Q1 to Q5) and six flux tunable buses (F1 to F5), resulting in 1.2 flux lines per qubit. The meandering flux line 1330 may have a length sufficient to flux bias many qubits with a single current. The meandering flux line 1330 may be gradiometric to other flux lines but not to the qubit. The meandering flux line 1330 may have RF chokes (not shown) to reduce crosstalk.

Example Process

With the foregoing overview of the example architecture, it may be helpful now to consider a high-level discussion of an example process. To that end, FIG. 14 is a flowchart illustrating a method of generating DC offsets in flux transmons, consistent with respective illustrative embodiments.

Figure 14:
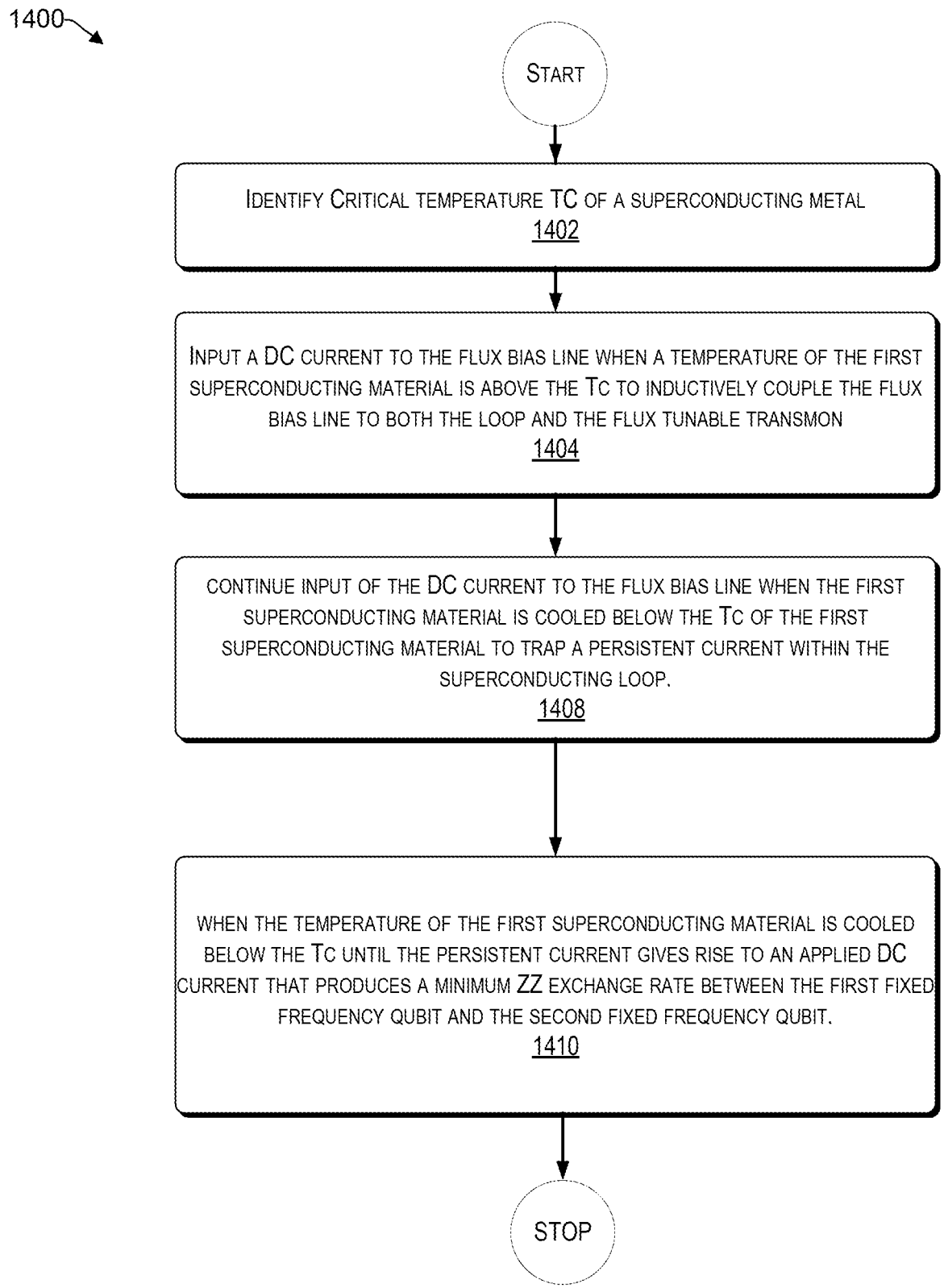
FIG. 14 is a flowchart illustrating a method of generating DC offsets in flux transmons, consistent with respective illustrative embodiments.

FIG. 14 is shown as a collection of blocks, in a logical order, which represents a sequence of operations that can be implemented in hardware, software, or a combination thereof. In each process, the order in which the operations are described is not intended to be construed as a limitation, and any number of the described blocks can be combined in any order and/or performed in parallel to implement the process.

At operation 1402, the critical temperature (Tc) of a superconducting metal is identified. For example, there may be two different superconducting materials used for respective purposes. In an embodiment, the flux bias line includes a first superconducting material that is configured to receive a DC current that to be inductively coupled to the flux tunable elements. The first superconducting material may have a higher Tc than a second superconducting material from which current loops have been formed on the wiring layer (which is not limited to an interposer).

At operation 1404, a DC current is input to the flux bias line (e.g., see FIG. 3, line 330) when a temperature of the first superconducting material is above the Tc to inductively couple the flux bias line to both the loop 310 and the flux tunable transmon 320.

At operation 1408, a current source (e.g., such as a DAC) continues to input the DC current to the flux bias line 330 when the first superconducting material is cooled below the Tc of the first superconducting material to trap a persistent current (ip) within the superconducting loop.

At operation 1410, when the temperature of the first superconducting material is cooled below the Tc until the persistent current gives rise to an applied DC current. The operations may be repeated until the persistent current gives rise to an applied DC current that produces a minimum ZZ exchange rate between the first fixed frequency qubit and the second fixed frequency qubit.

With regard to the method described above in the flowchart of FIG. 14, this embodiment is not exhaustive of the scope of the disclosure. For example, the methods may include one or more operations in addition to, or in lieu of, other operations.

Example Computer Platform

Figure 15:
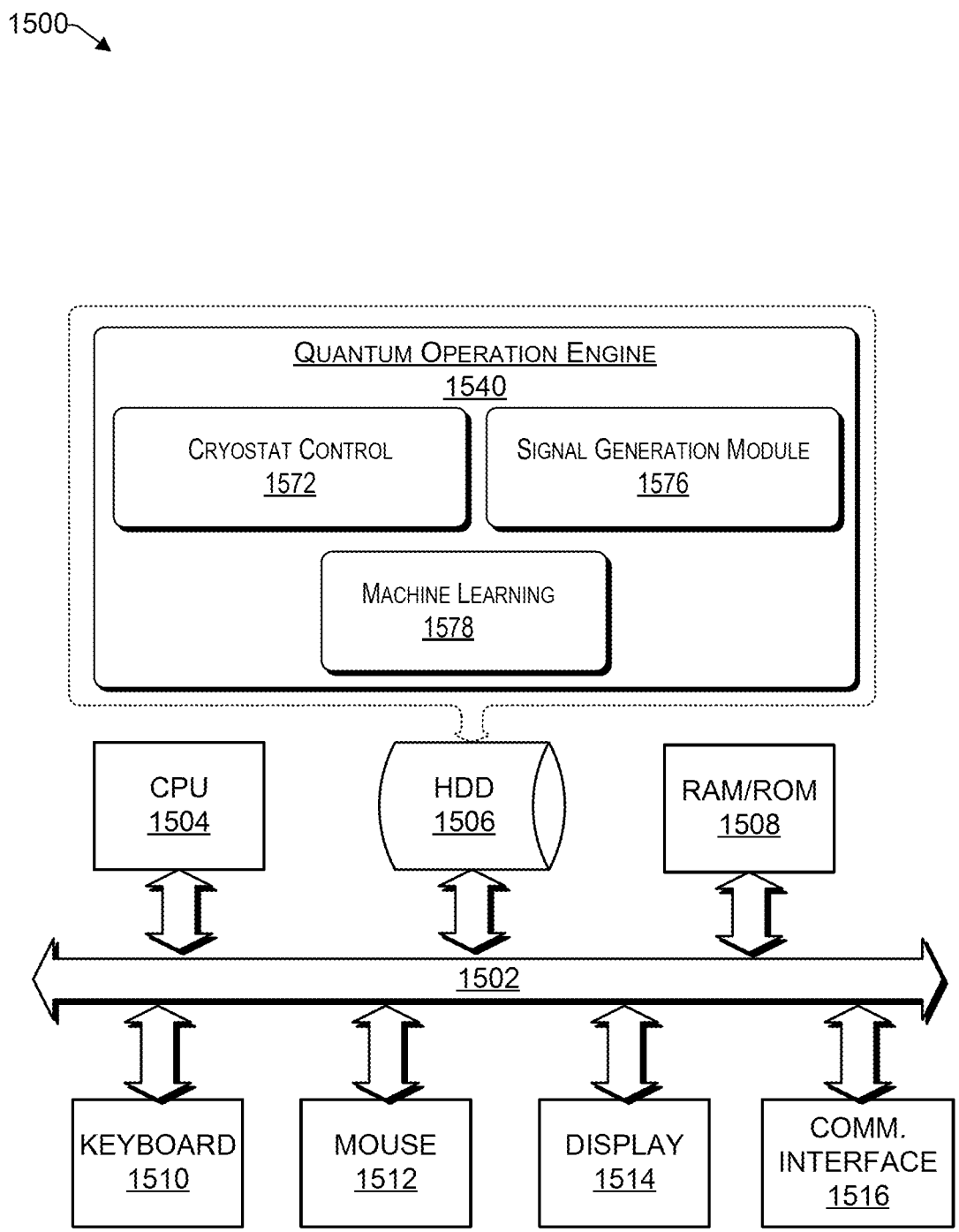
FIG. 15 provides a functional block diagram illustration of a computer hardware platform that may be used to implement a particularly configured computing device that can generate DC offsets in flux-tunable plasmons.

FIG. 15 provides a functional block diagram illustration of a computer hardware platform 1500 that can be used to implement a particularly configured computing device that can generate DC offsets in flux-tunable plasmons according to embodiments of the present disclosure. In particular, FIG. 15 illustrates a network or host computer platform 1500, as may be used to implement an appropriately configured server.

The computer platform 1500 may include a central processing unit (CPU) 1504, a hard disk drive (HDD) 1506, random access memory (RAM) and/or read only memory (ROM) 1508, a keyboard 1510, a mouse 1512, a display 1514, and a communication interface 1516, which are connected to a system bus 1502.

In one embodiment, the HDD 1506 has capabilities that include storing a program that can execute various processes, such as the quantum operation engine 1540, in a manner described herein. The quantum operation engine 1540 may have various modules configured to perform different functions, such those discussed in the context of figures discussed herein. For example, 1540 may include modules such as cryostat control module 1572 that controls the temperature of the cryostat and adjust accordingly as needed, a signal generation module 1576 that can use the DC current and a pulse current as a course and fine tuning of the current that will enter the cryostat to ensure quantum operations of the components, and a machine learning module 1578. The signal generation module 1576 may be configured to source the DC current to induce the persistent current in the first loop, the signal generation module is configured to adjust the DC current) to reduce an always-on entanglement (ZZ) between a pair of fixed-frequency qubits coupled to the first flux tunable couplers to a substantially minimum value. The signal generation module 1576 may also be configured to source the at least one current pulse ($i_{pulse}$, through the flux bias line; and a provide each current pulse at a value is based on a value of the $\Phi_{offset}$.

The machine learning module 1578 may be trained by supervised learning with samples as to how the operation of the device parameters may needed adjustment. The modules shown in FIG. 15 may be combined into fewer modules, and these modules are not exhaustive nor required for performing any particular operation.

While modules 1572, 1576 and 1578 are illustrated in FIG. 15 to be part of the HDD 1506, in some embodiments, one or more of these modules may be implemented in the hardware of the computing device 1500. For example, the modules discussed herein may be implemented in the form of partial hardware and partial software. That is, one or more of the components of the quantum operation engine 1540 shown in FIG. 15 may be implemented in the form of electronic circuits with transistor(s), diode(s), capacitor(s), resistor(s), inductor(s), varactor(s) and/or memristor(s). In other words, the quantum operation engine 1540 may be implemented with one or more specially-designed electronic circuits performing specific tasks and functions described herein.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowcharts, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A quantum circuit device, comprising:
    a qubit chip including a plurality of qubits and a plurality of flux tunable couplers;
    a plurality of fixed frequency qubits in a lattice structure, wherein each pair of the plurality of fixed frequency qubits is coupled to one flux tunable coupler; and
    a wiring layer coupled to the qubit chip, wherein the wiring layer includes:
        a loop comprising a superconducting material that is inductively coupled to the flux tunable couplers; and
        a flux bias line comprising a superconducting material that is different than the superconducting material of the loop, wherein the flux bias line is inductively coupled to both the loop and the flux tunable couplers.

2. The quantum circuit device according to claim 1, wherein the wiring layer further includes:
    a first flux bias line comprising a first superconducting material and configured to receive a DC current and at least one current pulse ($i_{pulse}$) that are inductively coupled to a first flux tunable couplers; and
    a first loop formed by a second superconducting material, that is inductively coupled to the first flux bias line, and inductively coupled to the first flux tunable couplers;
    wherein a magnetic field generated from the first flux bias line is configured to induce a persistent current in the first loop formed by the second superconducting material and a static flux offset ($\Phi_{offset}$) through the first flux tunable couplers.

3. The quantum circuit device according to claim 2,
    wherein the plurality of fixed frequency qubits comprises fixed frequency transmon qubits; and
    wherein the plurality of flux tunable couplers comprises flux tunable transmon couplers.

4. The quantum circuit device according to claim 2, further comprising a signal generation module configured to source the DC current to induce the persistent current in the first loop, the signal generation module is configured to adjust the DC current to reduce an always-on entanglement (ZZ) between a pair of fixed-frequency qubits coupled to the first flux tunable couplers to a substantially minimum value.

5. The quantum circuit device according to claim 2, further comprising: a signal generation module configured to source the at least one current pulse ($i_{pulse}$) through the flux bias line, wherein a value of each one current pulse is based on a value of the $\Phi_{offset}$.

6. The quantum circuit device according to claim 2, wherein:
the first superconducting material comprises niobium; and
the second superconducting material comprises aluminum.

7. The quantum circuit device according to claim 2, further comprising a global flux line arranged on the wiring layer proximal to the persistent current loops configured to receive an input of the DC current and generate a magnetic field within the persistent current loops.

8. The quantum circuit device according to claim 2, wherein:
the second superconducting material is shorted between two sections of a continuous flux bias line, wherein a loop is formed on each flux bias line;
the second superconducting material has a critical temperature (Tc) lower than the critical temperature of the first superconducting material and configured to generate a persistent current ($i_p$) that gets trapped in a loop formed of the overlapping superconductors; and
the persistent current loops are configured to generate a calibrated flux offset ($\Phi_{offset}$) based on applied temperature variations to the superconducting materials in the flux tunable transmons.

9. The quantum circuit device according to claim 2, wherein the flux bias line comprises one or more gradiometric loops.

10. The quantum circuit device according to claim 9, wherein a flux tunable transmon on a qubit chip is coupled to the pair of fixed frequency qubits on the qubit chip, and the qubit chip is coupled to the wiring layer that generates flux offsets from flux bias lines and persistent current loops.

11. The quantum circuit device according to claim 9, wherein a first flux tunable transmon is capacitively coupled to a first fixed frequency qubit and to a second fixed frequency qubit of the pair of fixed frequency qubits.

12. The quantum circuit device according to claim 11, wherein the first flux tunable transmon and the fixed frequency qubits are arranged in a lattice structure to form a multi-qubit device.

13. The quantum circuit device according to claim 1, wherein the flux bias line comprises a meandering bias line contiguous to the plurality of flux tunable couplers and configured to bias the plurality of flux tunable couplers substantially simultaneously.

14. A quantum circuit device, comprising:
a qubit chip including a plurality of qubits; and
a plurality of flux tunable elements, wherein each flux tunable element includes a respective flux tunable superconducting quantum interference (SQUID) loop, and each flux tunable element is coupled between a respective pair of fixed-frequency qubits;
a wiring layer coupled to the qubit chip, wherein the wiring layer includes:
a contiguous flux bias line comprising a first superconducting material disposed proximal to the flux tunable elements, and configured to output a DC current to provide an offset to the flux tunable elements simultaneously; and
a plurality of flux bias lines disposed non-contiguously to the flux tunable elements, wherein each of the flux bias lines is configured to output flux pulses and independently offset currents with a mutual inductance with the flux tunable elements.

15. The quantum device according to claim 14, where the contiguous flux bias line is arranged on a first side of the flux tunable elements, and the plurality of flux bias lines disposed non-contiguously are proximal to a second side of the flux tunable elements.

16. The quantum circuit device according to claim 14, wherein the plurality of flux bias lines comprise gradiometric flux coils.

17. The quantum device circuit according to claim 14, wherein the flux couplers on the qubit chip each have two spatially separated pickup coils being separately coupled to the contiguous bias line and the independent flux bias lines.

18. A method of generating DC offsets in flux-tunable elements, the method comprising:
inputting a DC current to a flux bias line in proximity to a flux tunable element when a temperature of a first superconducting material is above a critical temperature (Tc) to inductively couple the flux bias line to both the flux tunable element and a loop comprising the first superconducting material that encircles and the flux tunable element, wherein the flux bias line comprises a second superconducting material that is different than the first superconducting material; and
continuing inputting of the DC current to the flux bias line while cooling the first superconducting material below the Tc of the first superconducting material to trap a persistent current within the superconducting loop.

19. The method according to claim 18, wherein the inputting of the DC current is continued until the persistent current produces a minimum ZZ exchange rate between a first fixed frequency qubit and a second fixed frequency qubit.

20. The method according to claim 18, further comprising:
biasing the flux tunable elements to a zero-ZZ state; and
pulsing the flux bias line for each of the tunable elements to pulse them to an on state.

* * * * *